(12) United States Patent
Inan et al.

(10) Patent No.: US 9,921,116 B2
(45) Date of Patent: Mar. 20, 2018

(54) SYSTEM AND METHOD FOR ESTIMATING TEMPERATURES OF A HYDRAULIC FLUID CIRCULATED BY A HYDRAULIC PUMP OF A TRANSMISSION

(71) Applicant: GM Global Technology Operations LLC, Detroit, MI (US)

(72) Inventors: Mehmet Emin Inan, Ann Arbor, MI (US); Paul A. Adam, Milford, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 395 days.

(21) Appl. No.: 14/678,361

(22) Filed: Apr. 3, 2015

(65) Prior Publication Data
US 2016/0290498 A1 Oct. 6, 2016

(51) Int. Cl.
*G01D 1/00* (2006.01)
*G01L 3/00* (2006.01)
(Continued)

(52) U.S. Cl.
CPC ............... *G01L 3/00* (2013.01); *G01K 7/427* (2013.01); *G01K 13/02* (2013.01); *G01P 3/46* (2013.01);
(Continued)

(58) Field of Classification Search
None
See application file for complete search history.

(56) References Cited

U.S. PATENT DOCUMENTS 8,162,797 B2 4/2012 Pursifull
9,020,713 B1 4/2015 Houle et al.
(Continued)

FOREIGN PATENT DOCUMENTS

CN 101042187 A 9/2007
CN 102619974 A 8/2012
(Continued)

OTHER PUBLICATIONS

U.S. Appl. No. 14/087,432, filed Nov. 22, 2013, Houle et al.
First Office Action for Chinese Application No. 20110612647.X dated Jun. 13, 2016 with English language translation; 9 pages.

*Primary Examiner* — Cory Eskridge

(57) ABSTRACT

A system including a current module, a second module, and a temperature module. The current module is configured to determine an amount of current drawn from a power source by a hydraulic pump of a transmission based on a current signal received from a current sensor. The current signal is indicative of the current drawn by the hydraulic pump. The second module is configured to determine (i) a speed of the hydraulic pump based on a speed signal received from a speed sensor, or (ii) an output torque of the hydraulic pump based on the amount of current drawn by the hydraulic pump. The speed signal is indicative of the speed of the hydraulic pump. The temperature module is configured to estimate a temperature of a hydraulic fluid circulated by the hydraulic pump based on (i) the amount of current drawn by the hydraulic pump, and (ii) the speed or the output torque of the hydraulic pump. The second module is configured to adjust the speed of the hydraulic pump based on the temperature of the hydraulic fluid.

20 Claims, 5 Drawing Sheets

(51) Int. Cl.
*G01K 13/02* (2006.01)
*G01R 19/00* (2006.01)
*G01K 7/42* (2006.01)
*G01P 3/46* (2006.01)
*F16H 61/02* (2006.01)

(52) U.S. Cl.
CPC ...... *G01R 19/0092* (2013.01); *F16H 61/0204* (2013.01); *G01K 2013/026* (2013.01)

(56) References Cited

U.S. PATENT DOCUMENTS

| | | | | |
|---|---|---|---|---|
| 2002/0094910 | A1* | 7/2002 | Endo | B60K 6/48 477/97 |
| 2008/0132381 | A1 | 6/2008 | Seid et al. | |
| 2009/0118083 | A1* | 5/2009 | Kaminsky | B60K 6/365 477/5 |
| 2009/0118954 | A1* | 5/2009 | Wu | B60K 6/365 701/60 |
| 2010/0197441 | A1* | 8/2010 | Pursifull | F16H 57/0413 475/161 |
| 2011/0190986 | A1* | 8/2011 | Bitou | B62D 5/0463 701/41 |
| 2011/0282551 | A1* | 11/2011 | Sasaki | B62D 5/0463 701/42 |
| 2012/0191306 | A1 | 7/2012 | Baldwin et al. | |
| 2012/0245820 | A1* | 9/2012 | Miyamoto | F04B 49/20 701/102 |
| 2015/0337950 | A1* | 11/2015 | Knoth | B60K 6/48 701/60 |

FOREIGN PATENT DOCUMENTS

| | | |
|---|---|---|
| CN | 103363104 A | 10/2013 |
| CN | 104653763 A | 5/2015 |
| DE | 102014116340 A1 | 5/2015 |
| JP | H0495660 A | 3/1992 |

* cited by examiner

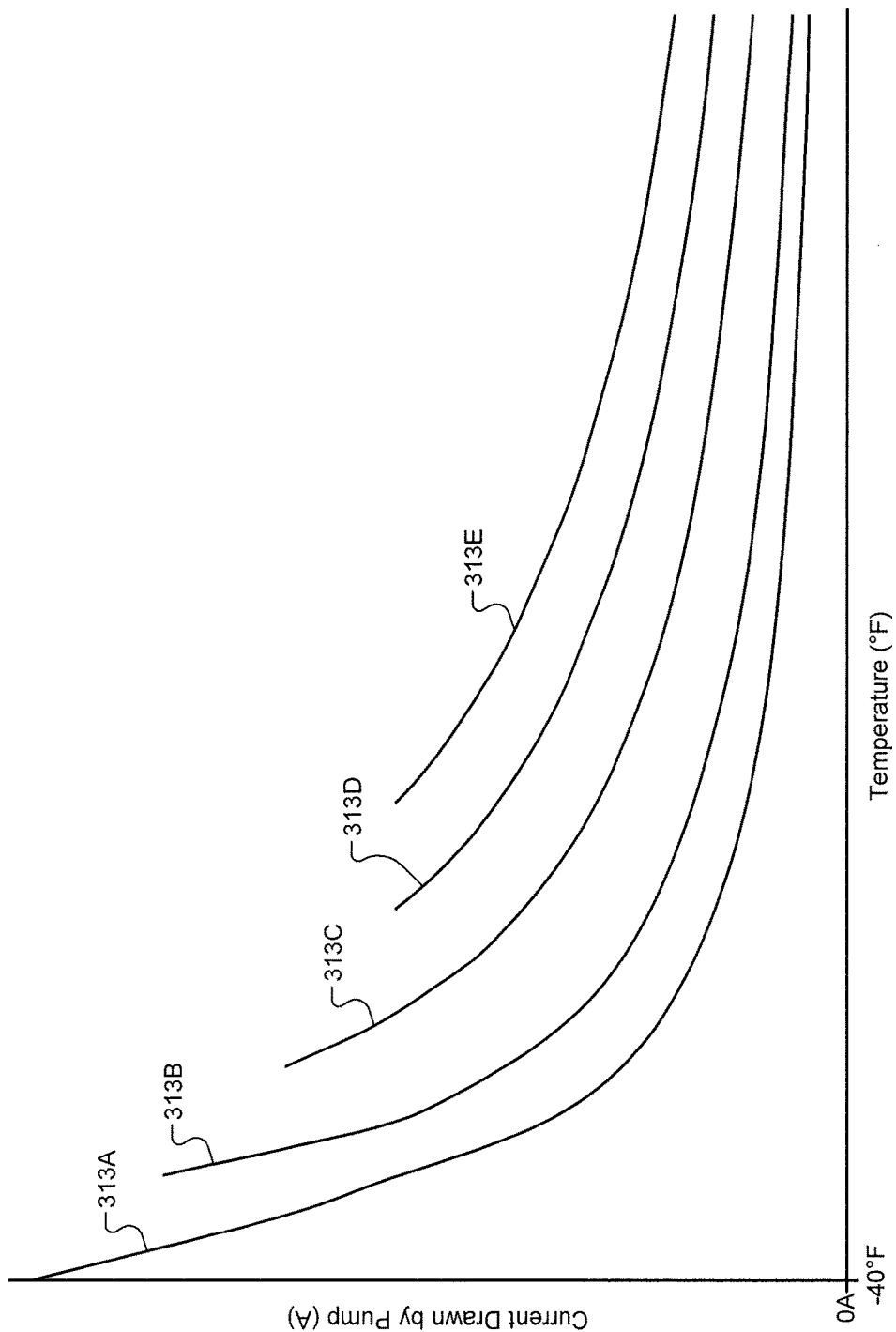

US 9,921,116 B2

SYSTEM AND METHOD FOR ESTIMATING TEMPERATURES OF A HYDRAULIC FLUID CIRCULATED BY A HYDRAULIC PUMP OF A TRANSMISSION

FIELD

The present disclosure relates to vehicle transmissions and more particularly to transmission pump control systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An engine generates torque and outputs torque to a transmission. An automatic transmission of a vehicle may include friction coupling elements, such as clutches and gear sets. A control module may engage and disengage the friction coupling elements to establish different gear ratios (also called speed ratios) within the transmission. The transmission may include a hydraulic pump that pumps hydraulic (or transmission) fluid to the friction coupling elements. The hydraulic fluid may be provided to the friction coupling elements to (i) control operation of the friction coupling elements, and (ii) lubricate and cool transmission components including some of the friction coupling elements. The hydraulic pump may be an electric pump.

SUMMARY

A system is provided and includes a current module, a second module, and a temperature module. The current module is configured to determine an amount of current drawn from a power source by a hydraulic pump of a transmission based on a current signal received from a current sensor. The current signal is indicative of the current drawn by the hydraulic pump. The second module is configured to determine (i) a speed of the hydraulic pump based on a speed signal received from a speed sensor, or (ii) an output torque of the hydraulic pump based on the amount of current drawn by the hydraulic pump. The speed signal is indicative of the speed of the hydraulic pump. The temperature module is configured to estimate a temperature of a hydraulic fluid circulated by the hydraulic pump based on (i) the amount of current drawn by the hydraulic pump, and (ii) the speed or the output torque of the hydraulic pump. The second module is configured to adjust the speed of the hydraulic pump based on the temperature of the hydraulic fluid.

In other features, a method is provided and includes: determining an amount of current drawn from a power source by a hydraulic pump of a transmission based on a current signal received from a current sensor, where the current signal is indicative of the current drawn by the hydraulic pump; and determining (i) a speed of the hydraulic pump based on a speed signal received from a speed sensor, or (ii) an output torque of the hydraulic pump based on the amount of current drawn by the hydraulic pump, where the speed signal is indicative of the speed of the hydraulic pump. The method further includes estimating a temperature of a hydraulic fluid circulated by the hydraulic pump based on (i) the amount of current drawn by the hydraulic pump, and (ii) the speed or the output torque of the hydraulic pump; and adjusting the speed of the hydraulic pump based on the temperature of the hydraulic fluid.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 5 is a current versus temperature plot in accordance with an embodiment of the present disclosure.

In the drawings, reference numbers may be reused to identify similar and/or identical elements.

DETAILED DESCRIPTION

An engine generates drive torque for a vehicle. A transmission coupled to the engine transfers torque from the engine to one or more wheels of the vehicle. A hydraulic pump of the transmission pumps hydraulic fluid from a transmission fluid source (e.g., a sump) to friction coupling elements and transmission components in the transmission and a torque converter. One or more regulator valves may regulate transmission fluid flow to clutches and transmission fluid flow back to the transmission fluid source. A transmission control module (TCM) may control actuation of the regulator valve(s).

A traction power inverter module may control operation of the hydraulic pump based on a temperature of a hydraulic fluid within the hydraulic pump. One or more sensors may be used to detect the temperature of the hydraulic fluid. As an alternative to using the sensors to detect the temperature, the temperature may be estimated based on other information. For example, the temperature may be estimated based on a speed of the hydraulic pump, torque output of the hydraulic pump, and/or current drawn by the hydraulic pump. Examples are disclosed below that include estimating temperatures of a hydraulic fluid within a hydraulic pump without the use of a temperature sensor.

Figure 1:
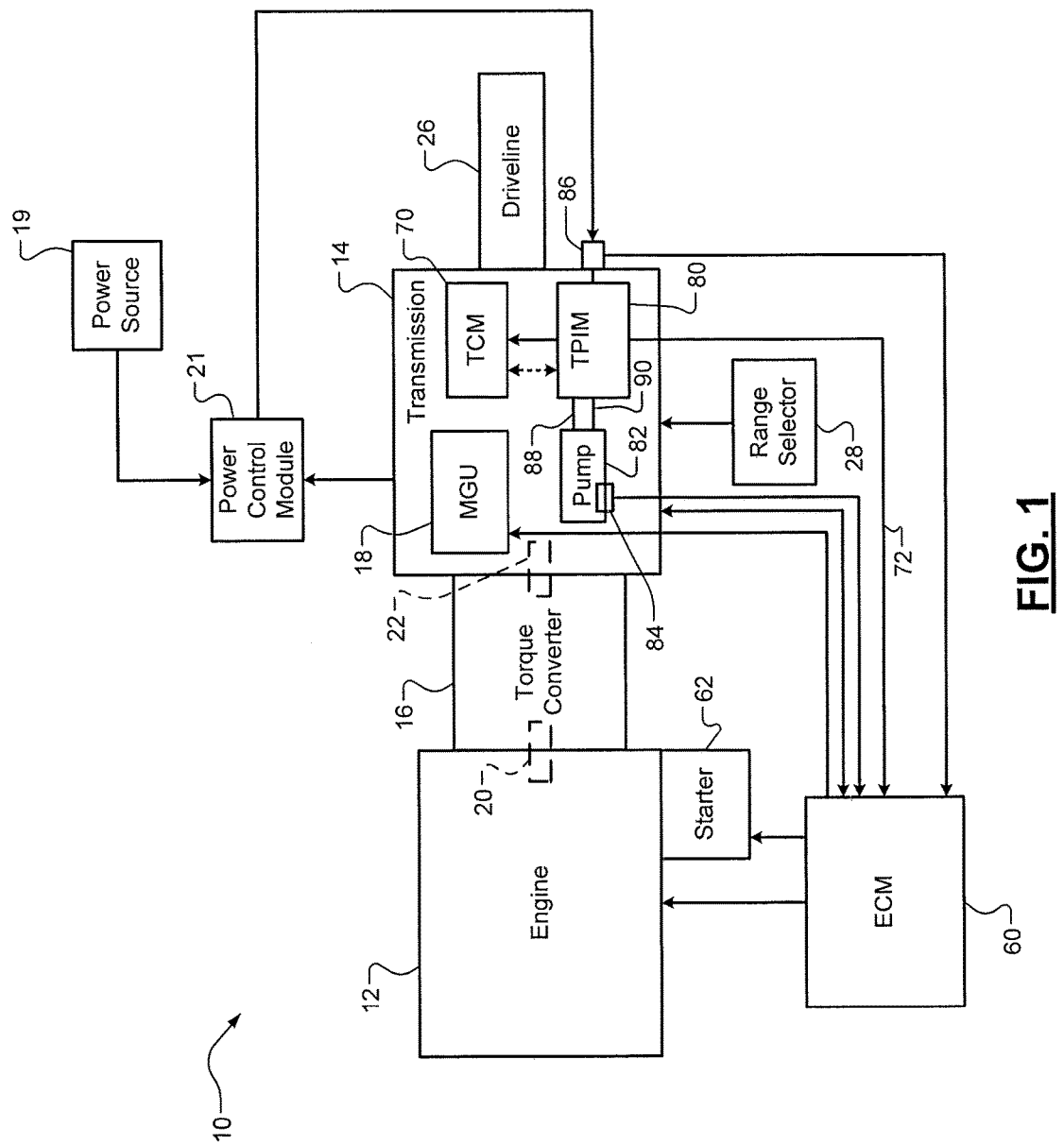
FIG. 1 is a functional block diagram of vehicle system including a transmission system with a traction power converter module in accordance with an embodiment of the present disclosure.

FIG. 1 shows a vehicle system 10 that includes an internal combustion engine (ICE) 12 that drives a transmission 14 via a torque converter 16. The ICE 12 may be, for example, a spark-ignition engine, a compression-ignition engine, or other suitable engine. The vehicle system 10 may also include one or more electric motors and/or motor generator devices (sometimes referred to as motor generator units or MGUs). An example MGU 18 is shown.

The ICE 12 may output torque to a pump side of the torque converter 16 via an engine output shaft 20, such as a crankshaft. An impeller side of the torque converter 16 may supply torque to the transmission 14 via a transmission input shaft 22. The electric motor(s) and/or MGU(s) may also output torque to the transmission input shaft 22 or to the torque converter 16 to supplement or replace engine output torque. A MGU may convert mechanical energy into electrical energy, for example, to recharge a power source 19 (e.g., one or more batteries) and/or to supply power for electronic components of a vehicle. The power supplied from the MGU 18 may be provided to a power control module 21 prior to be supplied to the power source 19.

The transmission 14 includes one or more gear sets (shown in FIG. 2) for transferring torque between the transmission input shaft 22 and a driveline 26. Each of the gear sets may have a respective gear ratio. A range selector 28 enables a user to select a mode of operation of the transmission 14. The mode may include, for example, a park mode, a reverse mode, a neutral mode, or one or more forward drive modes. Each mode of operation may have a respective gear set and/or gear ratio An engine control module (ECM) 60 controls the ICE 12. For example, the ECM 60 controls starting of the ICE 12 and shutting down of the ICE 12. The ECM 60 may start the ICE 12 using a starter 62 in response to a user input to start the ICE 12, for example, via an ignition button, switch, or key. The ECM 60 may shut down the ICE 12 in response to a user input, for example, via the ignition button, switch, or key.

The ECM also shuts down the ICE 12 for auto-stop events and starts the ICE 12 for auto-start events performed automatically without the driver requesting that the ICE 12 be shut down or later re-started. An auto-stop event includes shutting down the ICE 12 when one or more predetermined enabling criteria is/are satisfied and the driver has not requested that the ICE 12 be shutdown (e.g., while an ignition system is in an ON state). During an auto-stop event, the ECM 60 shuts down the ICE 12 and disables the provision of fuel to the ICE 12, for example, to increase fuel economy (by decreasing fuel consumption). An auto-stop event may be performed, for example, when the vehicle is stopped and a brake pedal is applied. Auto-stop events may also be performed while the vehicle is moving and the brake pedal is applied, when the driver has released an accelerator pedal, and/or other suitable instances. One or more of the generators may be controlled to apply a torque load on the ICE 12 to slow the ICE 12 to a stop within a predetermined period during auto-stop events. In other implementations, the ICE 12 may slow to a stop within the predetermined period during auto-stop events without a torque load from a generator. The ECM 60 and/or other control module (e.g., hybrid control module) may control starting, shut down, and fueling of the ICE 12. The ECM 60 and/or other control module may control operation of one or more of the MGUs and/or one or more electric motors.

While the ICE 12 is shut down for an auto-stop event, the ECM 60 may selectively perform an auto-start event when one or more predetermined enabling criteria is/are satisfied. An auto-start event may include, for example, enabling fueling, enabling the provision of spark, engaging the starter motor with the ICE 12, and applying current to the starter motor to start the ICE 12. The ECM 60 may perform an auto-start event, for example, when the driver releases the brake pedal.

A transmission control module (TCM) 70 controls operation of the transmission 14. While the TCM 70 is shown as being implemented within the transmission 14, the TCM 70 may be implemented externally to the transmission 14. The ECM 60 and the TCM 70 may share data via a connection 72, such as a car area network (CAN) bus. One example of data that may be shared between the ECM 60 and the TCM 70 is data regarding an auto-stop event of the ICE 12.

The transmission 14 may also include a traction power inverter module (TPIM) 80, a hydraulic pump 82, a speed sensor 84 and a current sensor 86. The TPIM 80, although shown separately, may be incorporated in and/or share information with the TCM 70 and/or the ECM 60. The TPIM 80 may be connected to the hydraulic pump 82 via a cable 88 (e.g., a 3-phase cable). The cable 88 may be used to supply an alternating current (AC) from the TPIM 80 to the hydraulic pump 82. The TPIM 80 may receive power and/or a direct current (DC) from the power source 19 and/or the power control module 21. The power control module 21 may control whether power is supplied to the TPIM 80 and/or an amount of power (voltage and/or current) supplied to the TPIM 80. The power control module 21 may also be included in the TCM 70 and/or in the ECM 60 or may be separately located, as shown. In one implementation, the TPIM 80 directly receives power from the power source 19.

The TPIM 80 controls operation of the hydraulic pump 82 by providing a control signal CONT via a communication line 90 to the hydraulic pump 82 indicating a target speed of the hydraulic pump 82, a target output torque (e.g., torque generated by the hydraulic pump 82 to circulate the hydraulic fluid) and/or one or more target output pressures of the hydraulic pump 82. The target output pressures may refer to output fluid pressures provided to components of the transmission 14 and/or the torque converter 16. The hydraulic pump 82 is used to circulate a hydraulic fluid throughout the transmission 14 and/or the torque converter 16 based on the control signal CONT.

Figure 3:
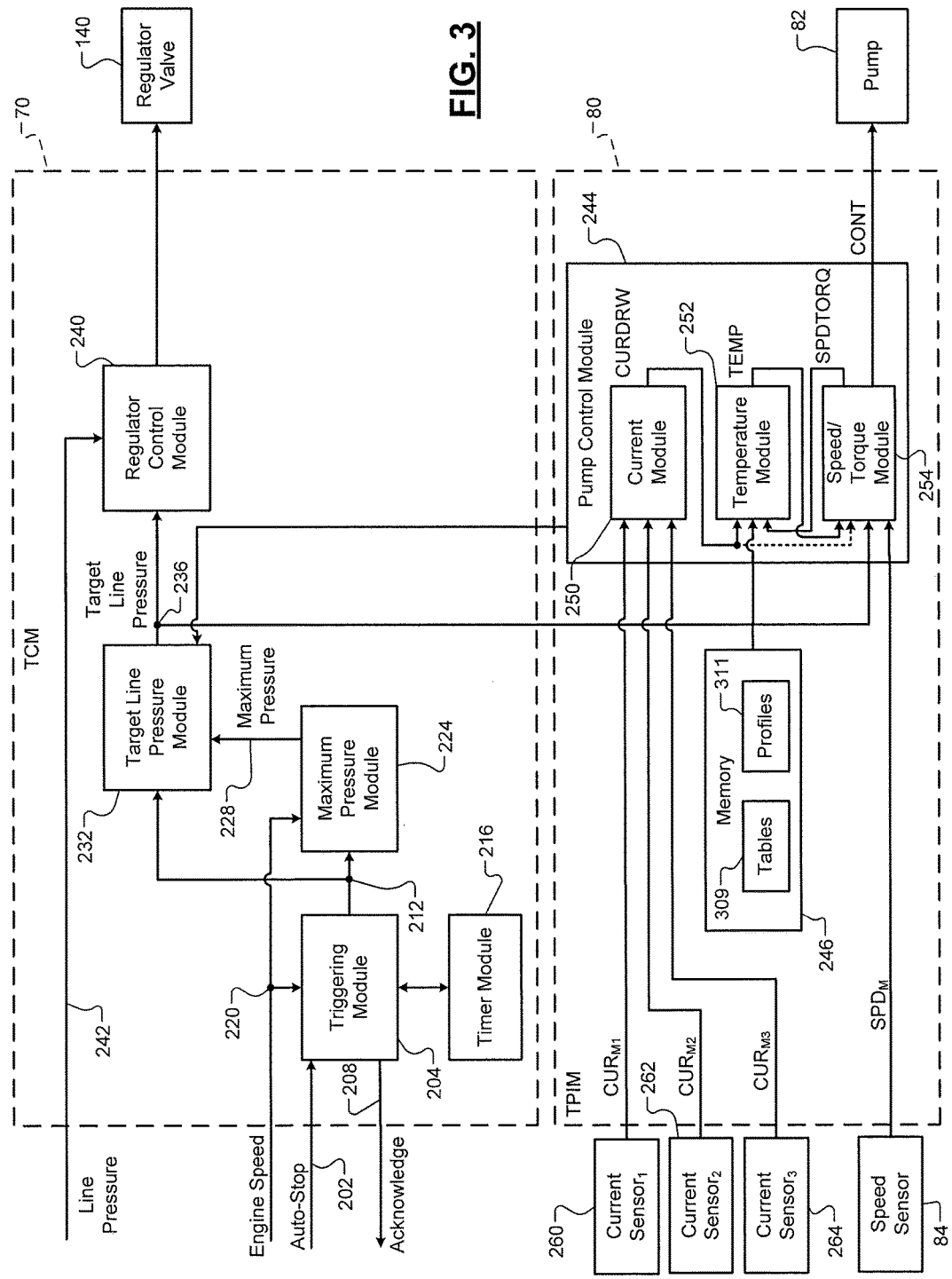
FIG. 3 is a functional block diagram of a transmission control module and the traction power converter module of FIG. 1.

The speed sensor 84 may be used to detect a speed of the hydraulic pump 82 (i.e. a speed of a component of the hydraulic pump 82). The current sensor 86 is used to detect an amount of current drawn by the hydraulic pump 82. Although a single current sensor is shown, multiple current sensors may be included, as shown in FIG. 3. A current sensor may be incorporated for each of the 3-phases of the hydraulic pump 82 and thus for each phase of the 3-phase cable 88. Each of the current sensors may detect a respective phase of the hydraulic pump 82. In one implementation only two current sensors are used to detect current drawn by two of the phases of the hydraulic pump 82. The third undetected phase or amount of current drawn by the third phase may be determined based on the currents drawn by the other two phases. For example, the third phase may be equal to a negative of a sum of the other two detected currents.

Figure 2:
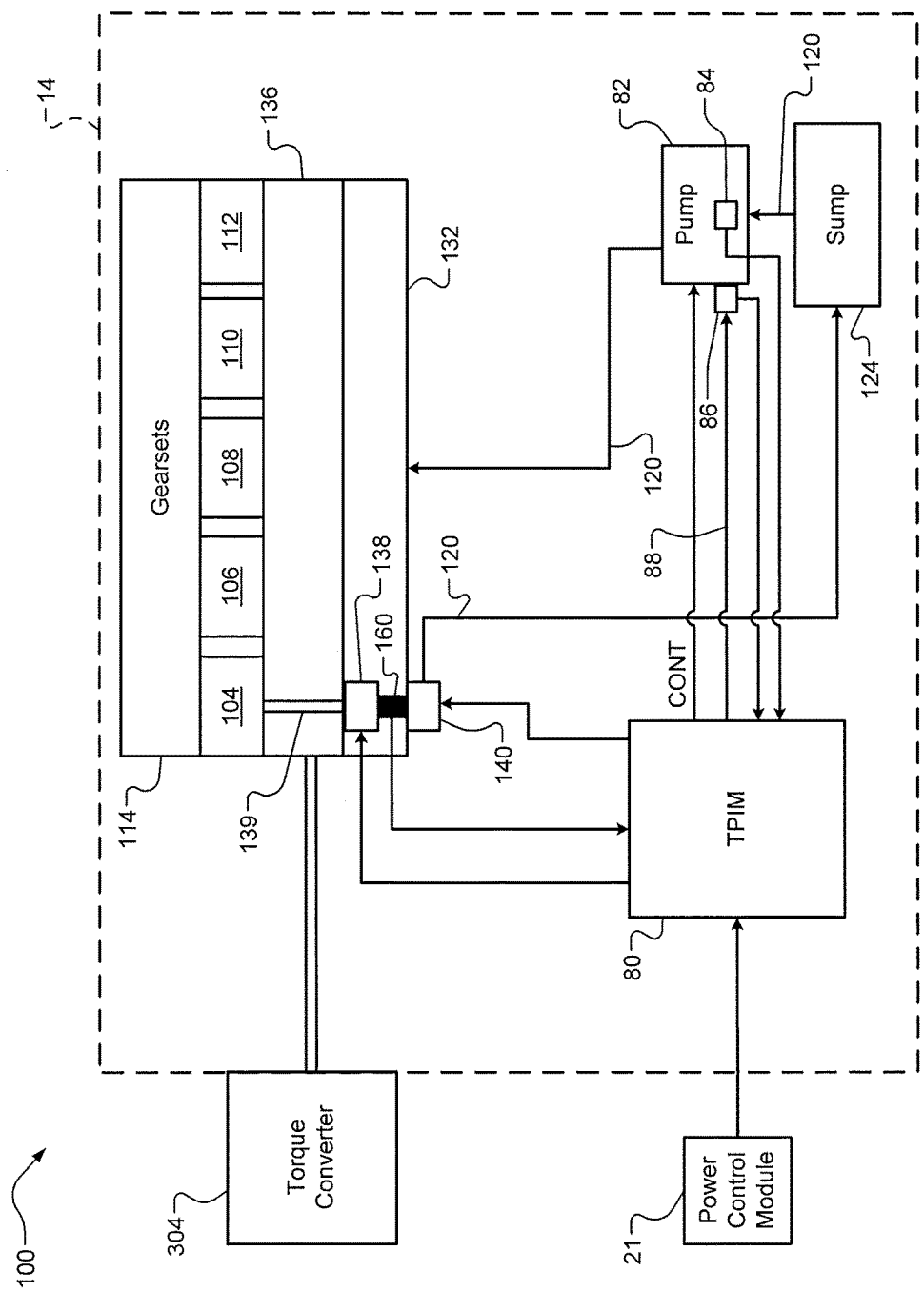
FIG. 2 is a functional block diagram of the transmission system including the traction power converter module of FIG. 1.

FIG. 2 shows a transmission system 100 that includes the transmission 14, the torque converter 16 and the power control module 21. The transmission 14 includes friction coupling elements, such as clutches 104, 106, 108, 110, and 112 and gear sets 114. The transmission 14 may include any number of clutches and gear sets.

The clutches 104, 106, 108, 110, and 112 control which one of the gear sets 114 is engaged within the transmission 14 at a given time. Different gear ratios may be established when different combinations of one or more of the clutches 104, 106, 108, 110, and 112 and gear sets 114 are engaged.

Transmission (or hydraulic) fluid 120 is directed to and from the friction coupling elements and may be provided to control engagement and disengagement of the friction coupling elements. A hydraulic pump 82 draws the transmission fluid 120 from a sump 124 or another suitable transmission fluid source. The hydraulic pump 82 pressurizes the transmission fluid 120 and provides pressurized transmission fluid to a valve body 132. The hydraulic pump 82 may also provide pressurized transmission fluid to the torque converter 16 and/or one or more other components.

The hydraulic pump 82 may also output transmission fluid for lubrication and cooling of one or more transmission components. The transmission fluid 120 may be passed through a transmission cooler (not shown). The transmission cooler transfers heat from the transmission fluid 120 flowing through the transmission fluid cooler to a cooling medium, such as air or coolant. The hydraulic pump 82 is an electric pump that is (i) driven based on electrical power supplied to the hydraulic pump 82, and (ii) controlled based on the control signal CONT from the TPIM 80. The hydraulic pump 82 may be a variable displacement pump.

The valve body 132 includes one or more control elements, such as clutch control solenoid 138, that controls flow of the transmission fluid 120 from the valve body 132 to the friction coupling elements and vice versa. The transmission fluid 120 flows between (i) the valve body 132 and (ii) the friction coupling elements and the torque converter 16 via passages, such as passages formed in a housing 136 of the transmission 14. Although the housing 136 is shown as being located within the transmission 14, the housing 136 may be an exterior housing and/or an integral portion of an exterior housing of the transmission 14. For example only, the clutch control solenoid 138 may control flow of the transmission fluid 120 between (i) the valve body 132 and (ii) the first clutch 104 via passage 139. One or more clutch control solenoids and passages may be provided for each of the friction coupling elements and/or the torque converter 16.

A regulator valve 140 controls flow of the transmission fluid 120 from the valve body 132 (at a relatively higher pressure) back to the sump 124 (at a relatively lower pressure). By controlling the flow of the transmission fluid 120 back to the sump 124, the regulator valve 140 also controls the pressure of the transmission fluid 120 input to the control solenoids and the friction coupling elements. For example only, the regulator valve 140 controls the pressure of the transmission fluid 120 input to the clutch control solenoid 138 and the first clutch 104. The regulator valve 140 may control the pressure of the transmission fluid 120 input to all of the clutch control solenoids. Multiple regulator valves may be included to control the pressure of the transmission fluid 120 input to subsets of one or more of the control solenoids.

The transmission 14 may include one or more pressure sensors. For example only, a line pressure sensor 160 may measure a pressure of the transmission fluid 120 input to the control solenoids. This pressure will be referred to as a line pressure. The TCM 70 controls the regulator valve 140 to adjust the line pressure toward a target line pressure. The transmission 14 may include any number of pressure sensors.

The transmission 14 includes the speed sensor 84 and the current sensor 86. Although one current sensor is shown, additional current sensors may be included as described above. The hydraulic pump 82 receives power via the 3-phase cable 88 from the TPIM 80.

Referring now to FIG. 1 and FIG. 3, which shows the TCM 70 and the TPIM 80. The TCM 70 includes: a triggering module 204 that receives an auto-stop signal and an acknowledgement signal 208; a timer module 216, a maximum pressure module 224, a target line pressure module 232 and a regulator control module 240. The TPIM 80 includes the speed sensor 84, a pump control module 244, and a memory 246.

The ECM 60 communicates an auto-stop signal 202 to the triggering module 204 for an auto-stop event of the ICE 12. The ECM 60 may transmit the auto-stop signal 202, for example, when the ECM 60 begins shutting down the ICE 12 for an auto-stop event or a predetermined period before beginning to shut down the ICE 12 for the auto-stop event. The auto-stop signal 202 therefore indicates that the ECM 60 is to shut down or is in the process of shutting down the ICE 12. The ECM 60 may transmit the auto-stop signal 202 for each auto-stop event.

When the triggering module 204 receives the auto-stop signal 202, the triggering module 204 determines whether transmission assistance can be used for the auto-stop. For example, the triggering module 204 may determine that transmission assistance can be used when no faults have been diagnosed in the TCM 70. When transmission assistance can be used for an auto-stop event, the triggering module 204 may transmit the acknowledgement signal 208 to the ECM 60 to indicate that the transmission 14 is to be used to apply a torque load on the ICE 12 to slow the ICE 12 for the auto-stop event. As discussed further below, the transmission 14 increases a torque load on the ICE 12 imposed by the transmission 14 during the auto-stop event.

The triggering module 204 selectively generates a trigger signal 212 when the auto-stop signal 202 is received. The triggering module 204 may generate the trigger signal 212 when one or more criteria are satisfied after the auto-stop signal 202 is received. For example, the triggering module 204 may reset and start a timer value tracked by the timer module 216 when the auto-stop signal 202 is received. The timer value may track a period since the auto-stop signal 202 was received. The triggering module 204 may generate the trigger signal 212 when the timer value becomes greater than a predetermined value. In other words, the triggering module 204 may generate the trigger signal 212 a predetermined period (corresponding to the predetermined value) after the receipt of the auto-stop signal 202. Additionally or alternatively, the triggering module 204 may generate the trigger signal 212 when an engine speed 220 becomes less than a predetermined speed after the receipt of the auto-stop signal 202. The engine speed 220 is measured, for example, based on positions of a crankshaft of the ICE 12, which may be measured using a crankshaft position sensor (not shown). The engine speed 220 may be provided by the ECM 60 to the modules 220, 224.

When the trigger signal 212 is generated, the maximum pressure module 224 determines a maximum line pressure 228 for the auto-stop event. The maximum line pressure 228 corresponds to a maximum value of the line pressure for the auto-stop event. In other words, the maximum line pressure 228 corresponds to a maximum value of pressure of the transmission fluid 120 output from the regulator valve 140 to the control solenoid(s) for the auto-stop event.

The maximum line pressure 228 may be a fixed predetermined pressure or a variable pressure. In the case of the maximum line pressure 228 being variable, the maximum pressure module 224 may determine the maximum line pressure 228, for example, based on the engine speed 220 when the auto-stop signal 202 is generated. The maximum pressure module 224 may determine the maximum line pressure 228, for example, using a function or a mapping that relates engine speeds to maximum line pressures. The maximum line pressure 228 may decrease as the engine speed 220 decreases, and vice versa.

The target line pressure module 232 sets a target line pressure 236. A regulator control module 240 controls the regulator valve 140 to achieve the target line pressure 236.

The regulator control module 240 may control the regulator valve 140 in closed-loop form and based on a line pressure 242. The line pressure 242 may be detected using the line pressure sensor 160. Although the line pressure sensor 160 is shown as detecting a return line pressure, the line pressure sensor 160 may detect a supply line pressure out of the hydraulic pump 82. The pump control module 244 may control output of the hydraulic pump 82 to achieve the target line pressure 236. For example, the pump control module 244 may increase a displacement, speed and/or output torque of the hydraulic pump 82 as the target line pressure 236 increases.

The target line pressure module 232 may set the target line pressure 236 based on one or more operating parameters such as: speed and/or output torque of the hydraulic pump 82; a temperature of the hydraulic fluid circulated by and/or within the hydraulic pump 82; and/or other parameters. This information may be provided by the TPIM 80 and/or the pump control module 244. When the trigger signal 212 is generated, the target line pressure module 232 increases the target line pressure 236 to the maximum line pressure 228. The target line pressure module 232 may, for example, ramp the target line pressure 236 up to the maximum line pressure 228 at a predetermined rate or increase the target line pressure 236 to the maximum line pressure 228 in another suitable manner.

As the target line pressure 236 increases, the regulator control module 240 may close the regulator valve 140 to restrict transmission fluid flow through the regulator valve 140 back to the sump 124. Restricting fluid flow through the regulator valve 140 back to the sump 124 increases the pressure of the transmission fluid 120 applied to one or more of the control elements, thereby increasing a torque load imposed on the ICE 12 by the transmission 14. More specifically, restricting fluid flow through the regulator valve 140 increases back pressure on the hydraulic pump 82 and increases the torque load imposed on the ICE 12 by the hydraulic pump 82.

This increased torque load on the ICE 12 may help slow the ICE 12 to a stop sooner during the auto-stop event than if the torque load was not increased. The transmission 14 also damps vibration experienced as the ICE 12 is shut down for the auto-stop event, thereby decreasing noise, vibration, and/or harshness experienced within a passenger cabin of the vehicle.

One or more electrical generators, such as an alternator or the MGU 18, may be controlled during auto-stop events to apply a torque load on the ICE 12 and to stop the ICE 12 within a predetermined period after auto-stop events begin. With the transmission 14 imposing a torque load on the ICE 12 during auto-stop events, a lower output electrical generator (e.g., alternator or MGU) may be implemented since the electrical generator may be relied upon to a lesser extent to slow the ICE 12 for auto-stop events.

Additionally, applying a torque load on the ICE 12 during auto-stop events using the transmission 14 warms the transmission fluid 120. This heating leaves the transmission fluid 120 warmer than it otherwise would have been when the ICE 12 is next started pursuant to an auto-start event. The frictional losses attributable to the transmission fluid 120 at the next auto-start event may therefore be lower due to the warming, which may provide a fuel efficiency increase. The target line pressure module 232 may decrease the target line pressure 236 from the maximum line pressure 228, for example, once the engine speed 220 reaches zero for the auto-stop event.

The pump control module 244 may include a current module 250, a temperature module 252 and a speed and/or torque module 254. The current module 250 may receive measured current draw signals $CUR_{M1}$, $CUR_{M2}$, $CUR_{M3}$ from respective current sensors 260, 262, 264. The current signals indicate amounts of current drawn by respective phases of the hydraulic pump 82. The temperature module 252 estimates a temperature of the hydraulic fluid circulated by and/or within the hydraulic pump 82. Although the temperature module 252 is described herein as estimating a temperature of the hydraulic fluid circulated by and/or within the hydraulic pump 82, the temperature module 252 may alternatively or in addition estimate a temperature of a component of the hydraulic pump 82 and/or an average temperature of the hydraulic pump 82 as a whole. Viscosity of the hydraulic fluid within the hydraulic pump 82 is related to the temperature of the hydraulic fluid. The viscosity is also related to current drawn by the hydraulic pump 82. As a result and as further described below, the temperature of the hydraulic fluid may be estimated based on the current drawn by the hydraulic pump 82. The speed/torque module 254 monitors output (e.g., speed signal $SPD_M$) of the speed sensor 84. The speed signal $SPD_M$ is indicative of a speed of a component of the hydraulic pump 82.

Figure 4:
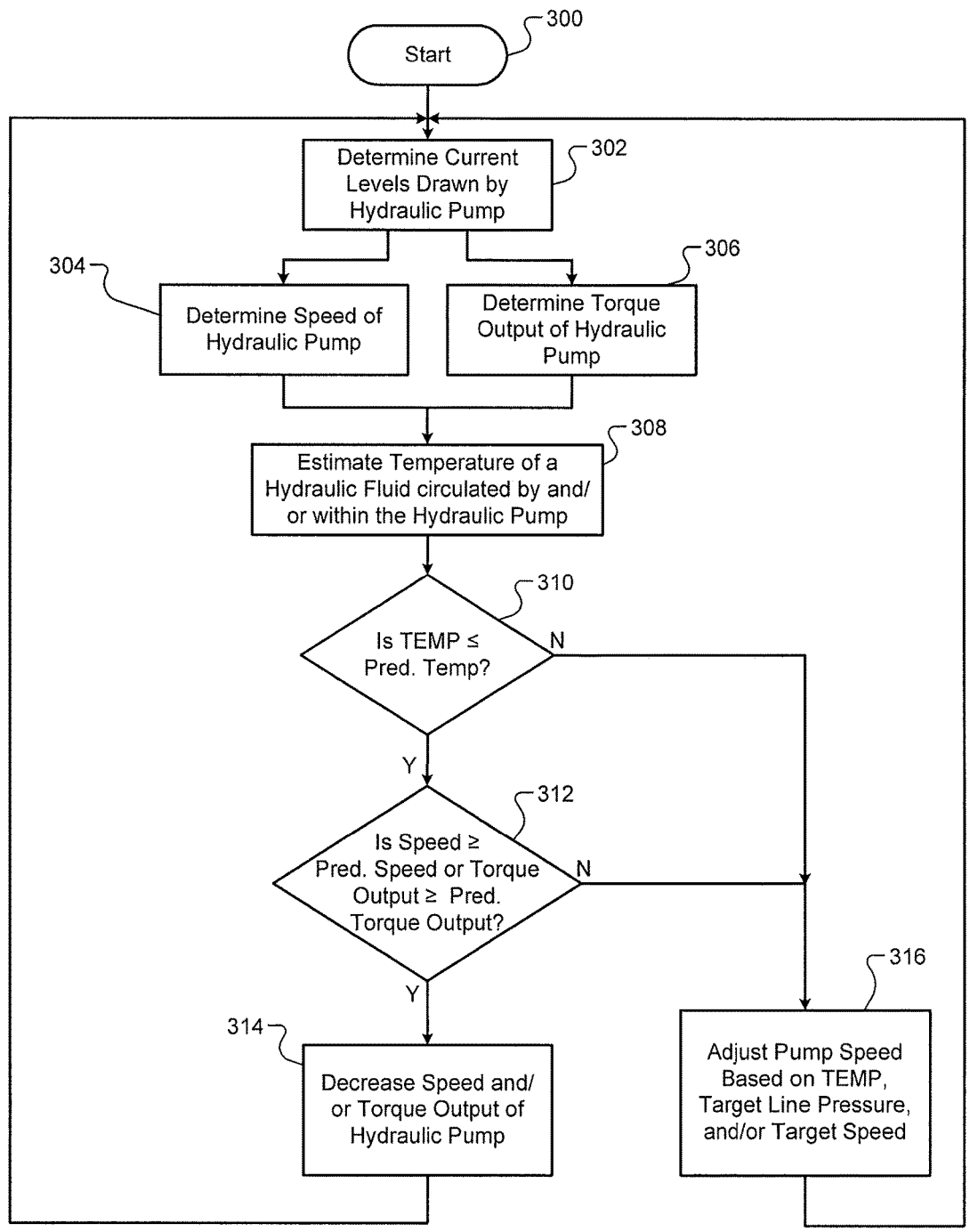
FIG. 4 illustrates a temperature estimation and hydraulic pump control method in accordance with an embodiment of the present disclosure.

Operation of the TPIM 80 is further described below with respect to the method of FIG. 4. The systems disclosed herein may be operated using numerous methods, an example method is illustrated in FIG. 4. In FIG. 4, a temperature estimation and hydraulic pump control method is shown. Although the following tasks are primarily described with respect to the implementations of FIGS. 1-3, the tasks may be easily modified to apply to other implementations of the present disclosure. The tasks may be iteratively performed.

The method may begin at 300. At 302, the current module 250 determines amounts of current drawn by one or more phases of the hydraulic pump 82. This may include receiving the current signals $CUR_{M1}$, $CUR_{M2}$, $CUR_{M3}$ and based on these signals generating a current draw signal CURDRW. The current draw signal CURDRW may indicate: a total amount of current drawn by the hydraulic pump 82; the amounts of current drawn by one or more phases of the hydraulic pump 82; an average amount of current drawn by the phases of the hydraulic pump 82; and/or other values indicative of amounts of current drawn by the hydraulic pump 82.

At 304, the speed sensor 84 may generate the speed signal $SPD_M$, which may indicate a speed of the hydraulic pump 82. At 306, the speed/torque module 254 may determine an amount of output torque (e.g., torque generated by the hydraulic pump 82 to circulate the hydraulic fluid) of the hydraulic pump 82. Current drawn from the hydraulic pump 82 is proportional to the output torque of the hydraulic pump 82. The output torque may be determined based on the current draw signal CURDRW. Task 304 and/or task 306 may not be performed.

At 308, the temperature module 252 estimates a temperature of the hydraulic fluid circulated by and/or within the hydraulic pump 82 as described above. The temperature module 252 may estimate the temperature based on previously generated tables 309, profiles 311, functions, control algorithms, and/or polynomial equations relating temperature of the hydraulic fluid to: one or more amounts of current drawn by the hydraulic pump 82; a speed of the hydraulic pump 82; and/or an output torque of the hydraulic pump 82. The temperature is estimated based on a predetermined relationship between (i) the temperature of the hydraulic fluid, (ii) the current drawn by the hydraulic pump 82, and (iii) the speed and/or output torque of the hydraulic pump 82. The current drawn by the hydraulic pump 82 is a function of a viscosity of a hydraulic fluid within the hydraulic pump 82. The viscosity of the hydraulic pump 82 is a function of the temperature of the hydraulic fluid in the hydraulic pump 82. As the temperature of the hydraulic fluid decreases the viscosity of the hydraulic fluid increases. For a given speed of the hydraulic pump 82, as viscosity of the hydraulic fluid increases, the amount of current drawn by the hydraulic pump 82 increases.

The tables 309 and profiles 311 may be stored in the memory 246 and accessed by the temperature module 252. Values of the tables 309 may be predetermined by collecting a range of speed and current data for the hydraulic pump 82. The data may alternatively or also be a result of operating the hydraulic pump 82 on a dyne at various temperatures. This data may be used to provide one or more of the profiles 311. As an example, the profiles may include current drawn versus temperature plots for respective speeds of the hydraulic pump 82. FIG. 5 shows example profiles 313A-E. Each of the profiles 313A-E (or shown curves) is for a respective operating speed of the hydraulic pump 82. Each of the profiles 313A-E may be for one or more phases of the hydraulic pump 82. For a certain speed and/or output torque, a profile may be provided for each phase or for the phases collectively (e.g., an average or total amount of current drawn by the phases). The units of measure for the operating speed of the hydraulic pump 82 may be revolutions-per-minute (RPM). As an example, the shown profiles 313A-E may be directed respectively to operating speeds of 100 RPM, 500 RPM, 1000 RPM, 1500 RPM, 2000 RPM. Any number of profiles may be used. One or more third degree polynomials may be derived based on the data in the tables 309 and/or profiles 311.

At 310, the speed/torque module 254 may compare the temperature to a predetermined temperature. The predetermined temperature may be determined based on the speed of the hydraulic pump 82, the output torque of the hydraulic pump 82, and/or the one or more amounts of current drawn by the hydraulic pump 82. For example, as the speed of the hydraulic pump 82 increases the predetermined temperature may be increased. As another example, as the output torque and/or the amount of current drawn by the hydraulic pump increases, the predetermined temperature may be increased. In one implementation, the predetermined temperature is a fixed value regardless of the speed, output torque and/or current drawn by the hydraulic pump 82. If the temperature of the hydraulic pump 82 is less than or equal to the predetermined temperature, task 312 may be performed otherwise task 316 may be performed.

At 312, the speed/torque module 254 may compare the speed of the hydraulic pump 82 to a predetermined speed and/or the output torque of the hydraulic pump 82 to a predetermined output torque. If the speed of the hydraulic pump 82 is greater than or equal to the predetermined speed and/or the output torque of the hydraulic pump 82 is greater than or equal to the predetermined output torque, then task 314 may be performed, otherwise task 316 may be performed.

Tasks 310 and 312 may be performed to prevent degradation of the hydraulic pump. Tasks 310 and 312 may be performed to prevent the hydraulic pump from operating at too high of a speed when the temperature is less than the predetermined temperature and the viscosity of the fluid is high. Tasks 310 and 312 may be performed to prevent the hydraulic pump from generating too much output torque and/or drawing too much current when the temperature is less than the predetermined temperature.

At 314, the speed/torque module 254 generates the control signal CONT to decrease the speed and/or output torque of the hydraulic pump 82. The resulting speed of the hydraulic pump 82 may be less than a previously determined target speed and/or the resulting output torque of the hydraulic pump 82 may be less than a previously determined target output torque of the hydraulic pump 82. This may include turning off the hydraulic pump 82. This limits the speed and output torque of the hydraulic pump 82. Task 302 may be performed subsequent to task 314.

At 316, the speed/torque module 254 adjusts the speed and/or output torque of the hydraulic pump 82 based on the temperature of the hydraulic fluid, the target line pressure, a target output torque of the hydraulic pump 82, and/or a target speed of the hydraulic pump 82. For example, the speed and/or the output torque of the hydraulic pump 82 may be increased as the temperature of the hydraulic fluid increases. A pump speed that achieves a target fluid pressure is adjusted based on the estimated temperature.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

The above-described examples eliminate the need for one or more temperature sensors and corresponding hardware and/or software. The software may include processor control and diagnostic software and/or signal processing software corresponding to the temperature sensors.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A system comprising:
a current module configured to (i) determine a total amount of current drawn from a power source by a hydraulic pump of a transmission based on current signals received from respectively a first current sensor and a second current sensor, and (ii) generate a first output signal indicating the total amount of current, wherein the current signals are indicative of amounts of current drawn by a first phase and a second phase of the hydraulic pump, wherein the current module is configured to (i) determine an amount of current drawn from a third phase of the hydraulic pump based on the amounts of current indicated by the current signals, and (ii) determine the total amount of current based on the amounts of current drawn by the first phase, the second phase and the third phase of the hydraulic pump;
a second module configured to
receive the first output signal, and
determine (i) a speed of the hydraulic pump based on a speed signal received from a speed sensor, or (ii) an output torque of the hydraulic pump based on the total amount of current drawn by the hydraulic pump, wherein the speed signal is indicative of the speed of the hydraulic pump; and
a temperature module configured to
estimate a temperature of a hydraulic fluid circulated by the hydraulic pump based on (i) the amount of current drawn by the hydraulic pump, and (ii) the speed or the output torque of the hydraulic pump, and
generate a second output signal indicating the temperature of the hydraulic fluid,
wherein the second module is configured to (i) receive the second output signal, and (ii) adjust the speed of the hydraulic pump based on the temperature of the hydraulic fluid.

2. The system of claim 1, comprising the first current sensor, the second current sensor and the speed sensor.

3. The system of claim 1, further comprising a power inverter module configured to receive direct current from the power source and convert the direct current to an alternating current, wherein:
the hydraulic pump draws at least a portion of the alternating current; and
the total amount of current drawn by the hydraulic pump includes the at least a portion of the alternating current.

4. The system of claim 1, wherein:
the second module is configured to determine the speed of the hydraulic pump based on the speed signal received from the speed sensor; and
the temperature module is configured to estimate the temperature of the hydraulic fluid based on the speed of the hydraulic pump.

5. The system of claim 1, wherein:
the second module is configured to determine the output torque of the hydraulic pump based on the amount of current drawn by the hydraulic pump; and the temperature module is configured to estimate the temperature of the hydraulic fluid based on the output torque of the hydraulic pump.

6. The system of claim 1, wherein:
the temperature module is configured to select one of a plurality of temperature profiles based on the speed or the output torque of the hydraulic pump;
each of the plurality of temperature profiles provides for a respective speed or output torque of the hydraulic pump a current versus temperature relationship; and
the temperature module is configured to estimate the temperature of the hydraulic fluid based on the selected one of the plurality of temperature profiles.

7. The system of claim 1, further comprising the hydraulic pump, wherein:
the second module is configured to generate a control signal based on the temperature of the hydraulic fluid; and
the hydraulic pump pumps the hydraulic fluid to friction coupling elements of the transmission based on the control signal.

8. A method comprising:
determining whether a fault has been diagnosed in a transmission control module;
in response to no fault being diagnosed in the transmission control module, triggering an auto-stop event of an engine;
determining a maximum line pressure of a hydraulic pump for the auto-stop event;
determining an amount of current drawn from a power source by the hydraulic pump of a transmission based on a current signal received from a current sensor, wherein the current signal is indicative of the current drawn by the hydraulic pump;
determining (i) a speed of the hydraulic pump based on a speed signal received from a speed sensor, or (ii) an output torque of the hydraulic pump based on the determined amount of current drawn by the hydraulic pump, wherein the speed signal is indicative of the speed of the hydraulic pump;
estimating a temperature of a hydraulic fluid circulated by the hydraulic pump based on (i) the determined amount of current drawn by the hydraulic pump, and (ii) the determined speed or the output torque of the hydraulic pump; and
adjusting a line pressure of the hydraulic pump to the maximum line pressure to increase load on the engine by the transmission including adjusting the speed of the hydraulic pump based on the estimated temperature of the hydraulic fluid.

9. The method of claim 8, further comprising:
supplying direct current via the power source;
converting the direct current to an alternating current; and
drawing at least a portion of the alternating current via the hydraulic pump,
wherein the determined amount of current drawn by the hydraulic pump includes the at least a portion of the alternating current.

10. The method of claim 8, further comprising:
receiving a 3-phase alternating current at the hydraulic pump;
detecting an amount of current supplied for a first phase of the hydraulic pump via the current sensor;
detecting an amount of current supplied for a second phase of the hydraulic pump via a third sensor; and
determining an amount of current supplied to a third phase of the hydraulic pump based on the determined amount of current supplied to the first phase and the determined amount of current supplied to the second phase,
wherein the determined amount of current drawn by the hydraulic pump includes the determined amount of current supplied for the first phase, the determined amount of current supplied for the second phase, and the determined amount of current supplied for the third phase.

11. The method of claim 10, further comprising generating a second current signal, wherein:
the second current signal indicates the determined amount of current supplied for the first phase and the determined amount of current supplied for the second phase; and
the temperature of the hydraulic fluid is estimated based on the second current signal.

12. The method of claim 8, wherein the determined amount of current drawn by the hydraulic pump is an amount of current drawn by a single phase of the hydraulic pump.

13. The method of claim 8, wherein the determined amount of current drawn by the hydraulic pump is an amount of current drawn by at least two phases of the hydraulic pump.

14. The method of claim 8, comprising:
determining the speed of the hydraulic pump based on the speed signal received from the speed sensor;
determining the output torque of the hydraulic pump based on the amount of current drawn by the hydraulic pump; and
estimating the temperature of the hydraulic fluid based on the speed of the hydraulic pump and the output torque of the hydraulic pump.

15. The method of claim 8, further comprising selecting one of a plurality of temperature profiles based on the speed or the output torque of the hydraulic pump, wherein:
each of the plurality of temperature profiles provides for a respective speed or output torque of the hydraulic pump a current versus temperature relationship; and
the temperature of the hydraulic fluid is estimated based on the selected one of the plurality of temperature profiles.

16. The system of claim 1, further comprising:
a triggering module configured to (i) determine whether a fault has been diagnosed in a transmission control module, and (ii) in response to no fault being diagnosed in the transmission control module, trigger an auto-stop event of an engine; and
a maximum pressure module configured to determine a maximum line pressure of the hydraulic pump for the auto-stop event,
wherein the second module is configured to adjust a line pressure of the hydraulic pump to the maximum line pressure to increase load on the engine by the transmission including adjusting the speed of the hydraulic pump based on the estimated temperature of the hydraulic fluid.

17. The method of claim 8, further comprising closing a regulator valve to restrict flow of the hydraulic fluid from the regulator valve to a sump to adjust the line pressure of the hydraulic pump to the maximum line pressure.

18. The method of claim 17, wherein the maximum line pressure is a pressure of the hydraulic fluid out of the regulator valve to control solenoids of the transmission.

19. The method of claim 8, further comprising supplementing the load on the engine provided by the transmission during the auto-stop event by applying a load on the engine via an electrical generator.

20. The method of claim 8, further comprising decreasing the line pressure of the hydraulic pump from the maximum line pressure when at least one of (i) a speed of the engine is zero, or (ii) the temperature of the hydraulic fluid is less than a predetermined temperature.

\* \* \* \* \*